United States Patent
Bechtle et al.

(10) Patent No.: US 6,535,091 B2
(45) Date of Patent: Mar. 18, 2003

(54) MICROELECTRONIC MECHANICAL SYSTEMS (MEMS) SWITCH AND METHOD OF FABRICATION

(75) Inventors: Daniel Bechtle, Hamilton Square, NJ (US); Gordon C. Taylor, Princeton, NJ (US); Ayre Rosen, Cherry Hill, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/993,095

(22) Filed: Nov. 6, 2001

(65) Prior Publication Data

US 2002/0075094 A1 Jun. 20, 2002

Related U.S. Application Data

(60) Provisional application No. 60/246,340, filed on Nov. 7, 2000.

(51) Int. Cl.[7] .................................................. H01P 1/10
(52) U.S. Cl. ........................................ 333/262; 200/181
(58) Field of Search ................................ 333/105, 262, 333/101; 200/181

(56) References Cited

U.S. PATENT DOCUMENTS

| 5,061,049 | A | * | 10/1991 | Hornbeck | 359/224 |
|---|---|---|---|---|---|
| 5,552,924 | A | | 9/1996 | Tregilgas | 359/224 |
| 5,578,976 | A | | 11/1996 | Yao | 333/262 |
| 5,579,151 | A | | 11/1996 | Cho | 359/291 |
| 5,619,061 | A | * | 4/1997 | Goldsmith et al. | 257/528 |
| 5,661,591 | A | * | 8/1997 | Lin et al. | 359/290 |
| 5,844,238 | A | | 12/1998 | Sauer et al. | 250/332 |
| 5,880,921 | A | * | 3/1999 | Tham et al. | 361/233 |
| 5,965,886 | A | | 10/1999 | Sauer et al. | 250/332 |
| 6,069,540 | A | | 5/2000 | Berenz et al. | 333/101 |
| 6,140,646 | A | | 10/2000 | Busta et al. | 250/332 |
| 6,218,911 | B1 | | 4/2001 | Kong et al. | 333/101 |
| 6,230,566 | B1 | | 5/2001 | Lee et al. | 73/514.32 |
| 6,307,452 | B1 | * | 10/2001 | Sun | 333/262 |

\* cited by examiner

*Primary Examiner*—Robert Pascal
*Assistant Examiner*—Dean Takaoka
(74) *Attorney, Agent, or Firm*—William J. Burke

(57) ABSTRACT

A microelectronic mechanical systems (MEMS) switch includes a vane formed over a substrate for electrically coupling an input line to an output line formed on the substrate. The vane includes flexible hinges, which support the vane from the input line and allow the vane to rotate about a pivot axis. The substrate includes pull-down and pull-back electrodes to actuate the MEMS switch. The pull-back electrode allows the present invention to overcome stiction effects.

17 Claims, 8 Drawing Sheets

MICROELECTRONIC MECHANICAL SYSTEMS (MEMS) SWITCH AND METHOD OF FABRICATION

CROSS-REFERENCE TO RELATED APPLICATIONS

This application claims benefit of U.S. provisional patent application Serial No. 60/246,340, filed Nov. 7, 2000, which is herein incorporated by reference.

GOVERNMENT RIGHTS IN THIS INVENTION

This invention was made with U.S. government support under contract number NMA202-97-D-1033/0019. The U.S. government has certain rights in this invention.

BACKGROUND OF THE INVENTION

1. Field of the Invention

The present invention generally relates to radio frequency switches and, more particularly, to a microelectronic mechanical system switch that is less susceptible to mechanical malfunction due to stiction effects.

2. Description of the Related Art

Radio frequency (RF) switches are widely used in microwave and millimeter wave integrated circuits (MMICs) for many antenna applications including phased arrays. In general, such applications rely on semiconductor solid state switches, such as GaAs MESFETs and PIN diodes. When the signal frequency exceeds about 1 GHz, solid state switches suffer from large insertion loss in the "On" state (i.e., closed circuit) and poor electrical isolation in the "Off" state (i.e., open circuit). Microelectronic mechanical system (MEMS) switches have distinct advantages over solid-state devices in all these characteristics, particularly above 1 GHz. MEMS technology is a process for fabricating components of an electronic circuit using micromachining.

In general, MEMS switches are susceptible to a phenomena known in the art as "stiction". Stiction generally occurs when attracting forces between contacting surfaces overpower the restoring force of the switching element. Stiction is variously attributed to micro-welding of metal species between contacts, build-up of non-metallic microcontaminates such as organic compounds between contacts, and electrostatic charge build-up on nearby or contacting dielectric materials. Stiction can cause the switch to malfunction by permanently sticking in the "on" position. It can also result in delayed switching and poor isolation in the "off" state.

Therefore, there exists a need in the art for a MEMS switch that is less susceptible to mechanical malfunction due to stiction effects.

SUMMARY OF THE INVENTION

The disadvantages associated with the prior art are overcome by a microelectronic mechanical system (MEMS) switch comprising a relatively inflexible vane and flexible hinges formed over a substrate for electrically coupling an input line to an output line formed on the substrate. The flexible hinges support the vane above the input line so as to define a pivot axis that is parallel to the substrate. The vane and hinges are actuated by pull-down and pull-back electrodes formed on the substrate. Specifically, when a predetermined DC voltage is applied to the pull-down electrode, electrostatic forces between the vane and the pull-down electrode pull the far end of the vane onto the output line, pull the middle of the vane onto the fulcrum, and flex the hinges. The DC voltage is subsequently removed from the pull-down electrode and a predetermined DC voltage is applied to the pull-back electrode. Electrostatic forces between the vane and the pull-back electrode pull the near end of the vane toward the pulldown electrode, and since the middle of the vane is on the fulcrum, the far end of the vane is levered off the contact. In the present invention, the force provided by the pull-back electrode acts in concert with the restoring force provided by the de-flexing of the hinges.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention is a microelectronic mechanical systems (MEMS) switch and a fabrication method thereof. As discussed below, the MEMS switch is configured to be less susceptible to stiction effects. In particular, an electrostatic force generated by a pull-back electrode results in higher speed during the contact break portion of the switching cycle. The "off" state position is also latched electrostatically, providing shock resistance and a reproducible RF isolation. Moreover, the MEMS switch has an in-line design to reduce parasitic reactance and improve its high-frequency performance. The fabrication method includes an additive process that is adaptable to a variety of low-loss microwave substrates. The present invention can be used in a MEMS switch array to implement true-time delay line circuits. Such true-time delay line circuits are used in adaptive beamformers of phased array systems. Although the present invention is described as being useful for implementing true-time delay line circuits, those skilled in the art will appreciate that the present invention is useful for many other applications that require RF switches, such as transmit/receive multiplexers and video switch matrices.

Figure 1:
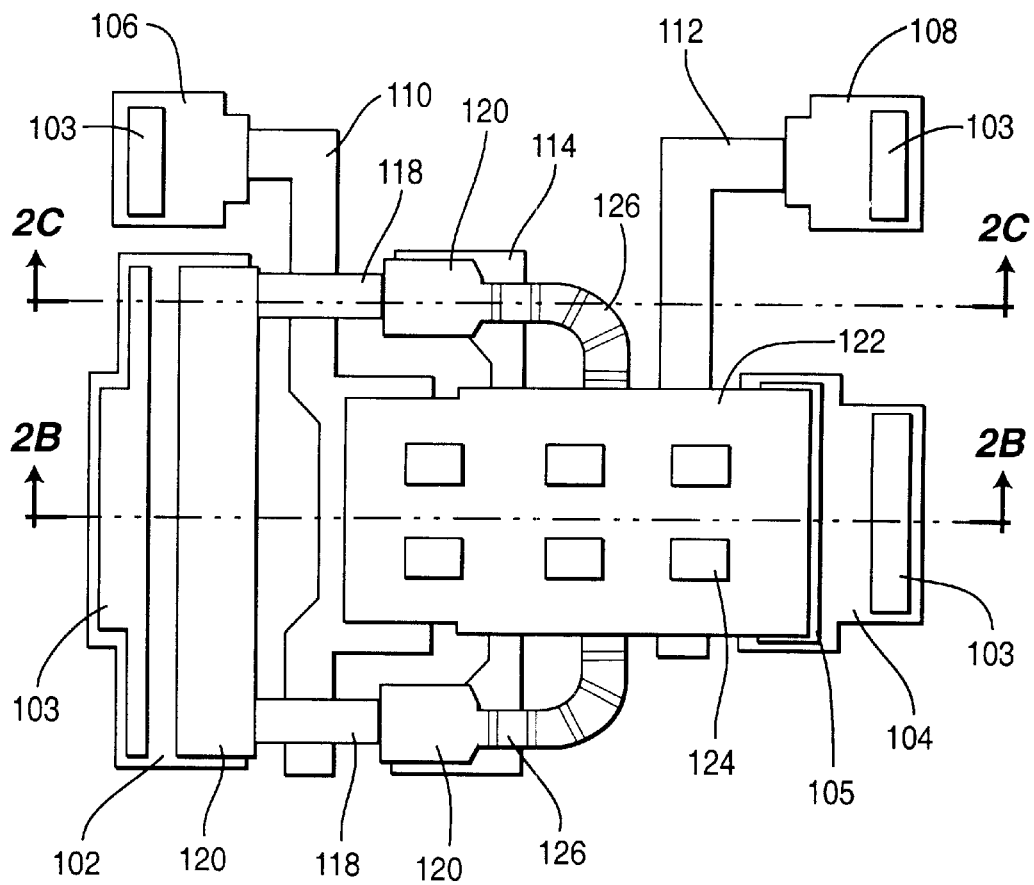
FIG. 1 depicts a top-plan view of a MEMS switch in accordance with the present invention.
Figure 2A:
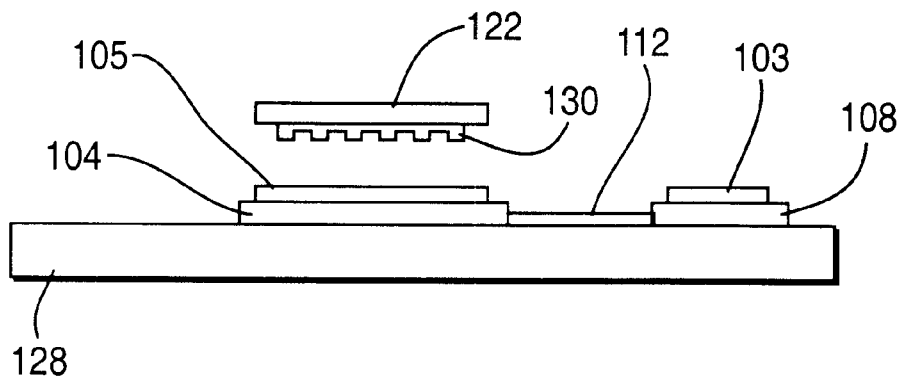
FIG. 2(a) shows an end view of the MEMS switch shown in FIG. 1.
Figure 2B:
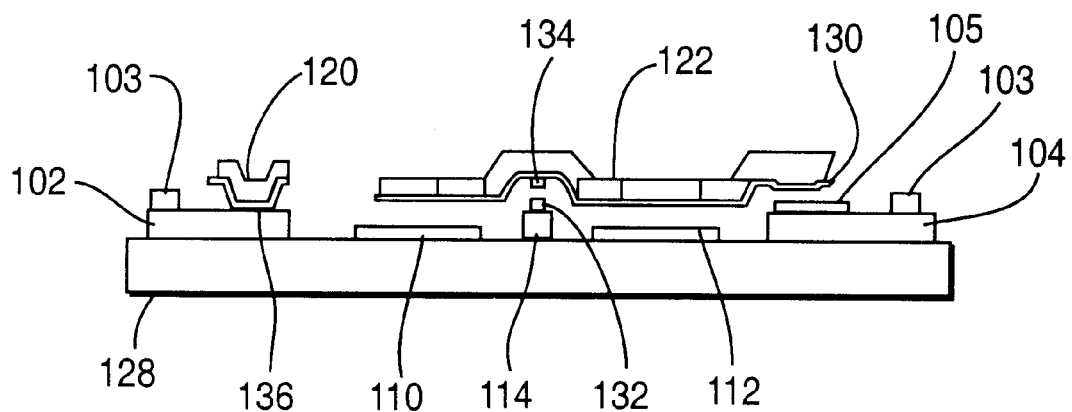
FIG. 2(b) shows a cross-section of the MEMS switch shown in FIG. 1 taken along the section line 2B—2B.
Figure 2C:
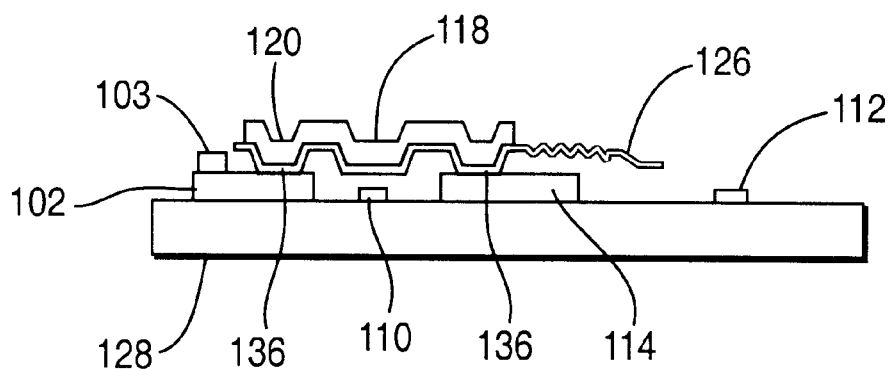
FIG. 2(c) shows a cross-section of the MEMS switch shown in FIG. 1 taken along the section line 2C—2C.

FIG. 1 depicts a top-plan view of a MEMS switch 100 in accordance with the present invention. FIG. 2a shows an end view of the MEMS switch 100. FIGS. 2b and 2c show a cross-sections of the MEMS switch 100 taken along the section lines 2B—2B and 2C—2C, respectively. The MEMS switch 100 is fabricated on a substrate 128 as described below with respect to FIGS. 6 and 7. The substrate 128 comprises a low-loss microwave insulating or semi-insulating substrate fabricated of materials such as quartz, alumina, sapphire, Low Temperature Ceramic Circuit on Metal (LTCC-M), Gallium Arsenide (GaAs), or high-resistivity silicon.

In one embodiment, the MEMS switch 100 comprises a frame 120, a vane 122, flexible hinges 126, a pull-back electrode 110, and a pull-down electrode 112. The MEMS switch 100 selectively couples an RF signal present at an input transmission line 102 (input line) to an output transmission line 104 (output line). The input and output lines 102 and 104 are formed on the substrate 128 and are generally coupled to other elements (not shown), such as transmission lines and like type microwave circuit elements. The input and output lines 102 and 104 comprise metal lines, such as plated gold (Au) lines.

The pull-back and pull-down electrodes 110 and 112 are formed on the substrate 128 between the input and output lines 102 and 104 beneath the vane 122. The pull-back and pull-down electrodes 110 and 112 can be encapsulated with an insulator, such as silicon nitride ($Si_3N_4$). The pull-back and pull-down electrodes 110 and 112 are coupled to field plates 106 and 108, respectively. Field plates 106 and 108 comprise metal contacts, such as plated gold contacts. The pull-back and pulldown electrodes 110 and 112 comprise moderately resistive lines, such as chromium (Cr) lines. Alternatively, the areas of the electrodes 110 and 112 directly under the vane 122 can be made of low-resistance metals, such as gold. In either case, the portion of the electrodes 110 and 112 leading between the vane 122 and the field plates 106 and 108 are resistive. The effect is to reduce the parasitic RF coupling between the vane 122 and the field plates 106 and 108. As described below, electrical potentials are applied to the field plates 106 and 108 and are conducted to the areas of the electrodes 110 and 112 directly under the vane 122, thereby controlling the movement of the vane 122 and flexure of the hinges 126.

A ridge transmission line 114 (ridge line) is formed on the substrate 128 between the pull-back and pull-down electrodes 110 and 112 beneath the vane 122. The ridge line 114 includes a lower fulcrum 132, which is electrically coupled to the ridge line 114. The ridge line 114 and lower fulcrum 132 comprise metal, such as plated gold (Au). The ridge line 114 is electrically coupled to the input line 102 via the frame 120. The frame 120 is supported from the input line 102 and the ridge line 114 via posts 136. The frame 120 includes cross-overs 118 traversing above the pullback electrode 110 for isolating the frame 120 from the pull-back electrode 110.

The vane 122 comprises a plate having an upper fulcrum 134, an upper contact 130, and a plurality of openings 124. The vane 122 is formed of relatively inflexible material, such as plated metal, evaporated metal, or dielectric material on top of a metal seed layer. The flexible hinges 126 are formed of thin flexible metal connecting the sides of the vane 122 to the frame 120 such that the vane 122 and the hinges 126 are disposed above the substrate 128. In addition, the flexible hinges 126 electrically couple the vane 122 to the frame 120. The hinges 126 allow the vane 122 to rotate about an axis that is parallel to the substrate 128 and above the fulcrum 132 (hereinafter the pivot axis). The hinges 126 can be flat or corrugated, as shown in FIG. 1. Corrugated hinges 126 allow for the distribution of flex when the vane 122 rotates about the pivot axis.

The upper fulcrum 134 is formed of metal, such as layers of evaporated gold and titanium. The upper fulcrum 134 is formed between opposing ends of the vane 122 and faces the lower fulcrum 132 formed on the ridge line 114. As described below, the upper fulcrum 134 contacts the lower fulcrum 132 during operation of the MEMS switch 100. The upper fulcrum 134 can be sharply defined, which allows for increased contact pressure between the vane 122 and the lower fulcrum 132. Those skilled in the art, however, will appreciate that the MEMS switch 100 can be formed with only one of the upper fulcrum 134 or the lower fulcrum 132 with a consequent reduction in pull-down and pull-back voltage requirements, but with a reduced RF isolation. In such an embodiment, the vane 122 itself will contact with the lower fulcrum 132, or the upper fulcrum 134 will contact the ridge line 114.

The upper contact 130 is formed on an end of the vane 122 and faces a lower contact 105 on the output line 104. The upper contact 130 is formed of metal similar to the upper fulcrum and can be flat or dimpled, as shown in FIG. 2a. When the switch 100 is actuated, the upper contact 130 contacts the lower contact 105. "Dimpling" the upper contact 130 increases contact pressure between the upper contact 130 and the lower contact 105. A dimpled or serrated electrical contact 130 further compensates for non-uniformities in the plated output line 104, as well as provide for higher isolation when the switch 100 is in the "off" state.

FIG. 3 depicts the operation of the MEMS switch 100. In the equlibrium state, the end of the vane 122 having the upper contact 130 is suspended above the lower contact 105. In operation, electrostatic forces actuate the MEMS switch 100 between a pull-down position (i.e, "on" position) and a pull-back and/or equilibrium position (i.e., "off" position). The electrostatic forces are created by applying a predetermined DC voltage to one of the pull-down and pull-back electrodes 112 and 110. The input and output lines 102 and 104 are DC grounded. Since the vane 122 is electrically coupled to the input line 102 through the frame 120, the vane is also at DC ground. The DC operation of the present invention provides comparatively higher isolation and lower parasitics (e.g., reactance between the RF signal and the electrodes 110 and 112) than MEMS switches under AC operation. In addition, electrostatic activation consumes less switching energy and negligible standby power when compared to MEMS switches employing thermal and/or electromagnetic activation.

Figure 3A:
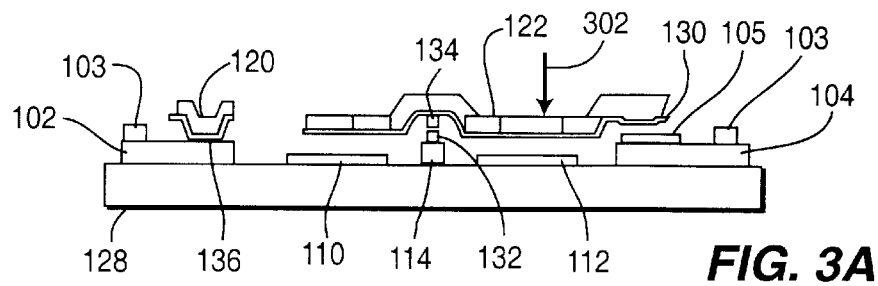
FIG. 3(a) illustrates the MEMS switch in a partial pull-down position.

Specifically, FIG. 3a shows the MEMS switch 100 in a partial pull-down position. In this partial pull-down position, a DC voltage has been applied to the field plate 108, which results in an electrostatic attraction force between the pull-down electrode 112 and the DC grounded vane 122. As understood by those skilled in the art, this electrostatic attraction force results when a difference of potential exists between two metallic elements thereby forming a parallel plate capacitor. The electrostatic attraction force produces a torque on the vane 122 indicated by arrow 302. This electrostatically induced torque overcomes the mechanical restoring force created by the hinges 126. As such, the vane 122 begins to rotate such that the upper contact 130 moves towards the lower contact 105. In addition, the electrostatically induced torque causes the upper fulcrum 134 to contact the lower fulcrum 132. Once the upper fulcrum 134 and lower fulcrum 132 are in contact, they form the pivot axis of the vane122.

Figure 3B:
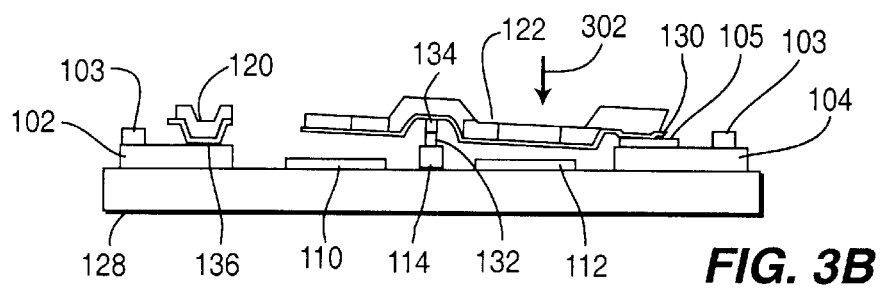
FIG. 3(b) illustrates the MEMS switch in a pull-down position.

FIG. 3b shows the MEMS switch 100 in the pull-down state. The electrostatically induced torque causes the hinges 126 to flex and the vane 122 to rotate such that the upper contact 130 contacts the lower contact 105. As a result of the vane's movement, a conductive path is formed between the input line 102 and the output line 104 through the flexible hinges 126 and the vane 122. Specifically, the RF signal present at the input contact 102 conducts through the frame 120, through the hinges 126, through the vane 122, through the upper contact 130, and to the lower contact 105 on the output line 104. The contact between the vane 122 and the ridge line 114 supplements the conductive path through the thinner hinges 126. The plurality of openings 124 dissipate air pressure that can result between the vane 122 and the substrate 128 due to any air trapped therebetween.

Figure 3C:
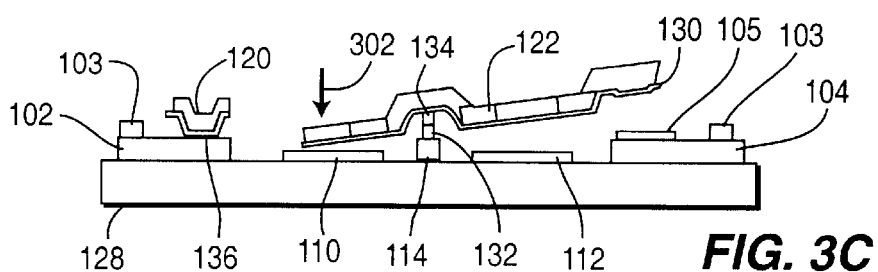
FIG. 3(c) illustrates the MEMS switch in a pull-back position.

When the DC voltage applied to the field plate 108 is removed, there is no electrostatic attraction between the vane 122 and the pull-down electrode 112, and consequently, no electrostatically induced torque on the vane 122. Thus, the mechanical restoring force exerted by the hinges 126 on the vane 122 works to move the upper contact 130 away from the lower contact 105. Stiction effects, however, can cause the upper contact 130 to remain in contact with the lower contact 105 despite the mechanical restoring force of the hinges 126. To overcome stiction effects, a predetermined DC voltage is applied to field plate 106, which results in an electrostatic attraction force between the pull-back electrode 110 and the DC grounded vane 122. As shown in FIG. 3c, the electrostatic attraction force produces a torque on the vane 122 indicated by arrow 304. This electrostatically induced torque combines with the mechanical restoring force created by the hinges 126. This combined torque causes the vane 122 to rotate about the pivot axis such that the upper contact 130 breaks contact with, and moves away from, the lower contact 105.

The MEMS switch 100 of the present invention is "in-line" with the RF transmission. That is, the conductive path formed when the MEMS switch 100 is in the pull-down position is a straight path between the input and output lines 102 and 104. The in-line design results in lower stray capacitance and better high-frequency performance than MEMS designs with cantilever elements perpendicular to RF signal flow. By employing the pull-back electrode 110, the present invention overcomes stiction effects that commonly occur in MEMS switches. The present invention also allows for an increased switching speed because the restoring force is electrical as well as mechanical. In addition to supplementing the mechanical restoring force of the flexible members 126, the pull-back electrode 110 can be used to lock the vane 122 in the pull-back position. Locking the vane in the pull-back position allows for shock and vibration protection and for a reproducible isolation.

Figure 4:
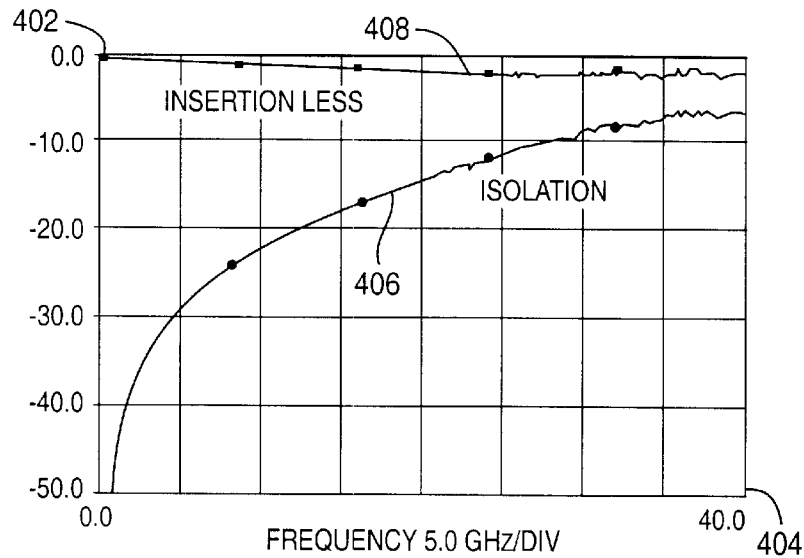
FIG. 4 depicts a graph of the insertion loss and isolation of the MEMS switch shown in FIG. 1 for frequencies ranging from DC to 40 GHz.

FIG. 4 depicts a graph of the insertion loss and isolation of the MEMS switch 100 for frequencies ranging from DC to 40 GHz. Specifically, axis 402 represents the magnitude of the insertion loss or isolation in decibels (dB), and axis 404 represents the frequency of the RF signal in 5 GHz divisions. The insertion loss 408 of the MEMS switch 100 is due primarily to a contact resistance between the input and output lines 102 and 104 and a small capacitance between the input line 102 and the electrodes 110 and 112. As illustrated, the MEMS switch 100 exhibits a small insertion loss from DC to 10 GHz, and maximally a 3 dB insertion loss from 10 GHz to 40 GHz. The isolation 406 is attributed primarily to small capacitances between the upper contact 130 and lower contact 105, and between the vane 122 and the electrodes 110 and 112, when the MEMS switch 100 is in the "off" state.

Figure 5:
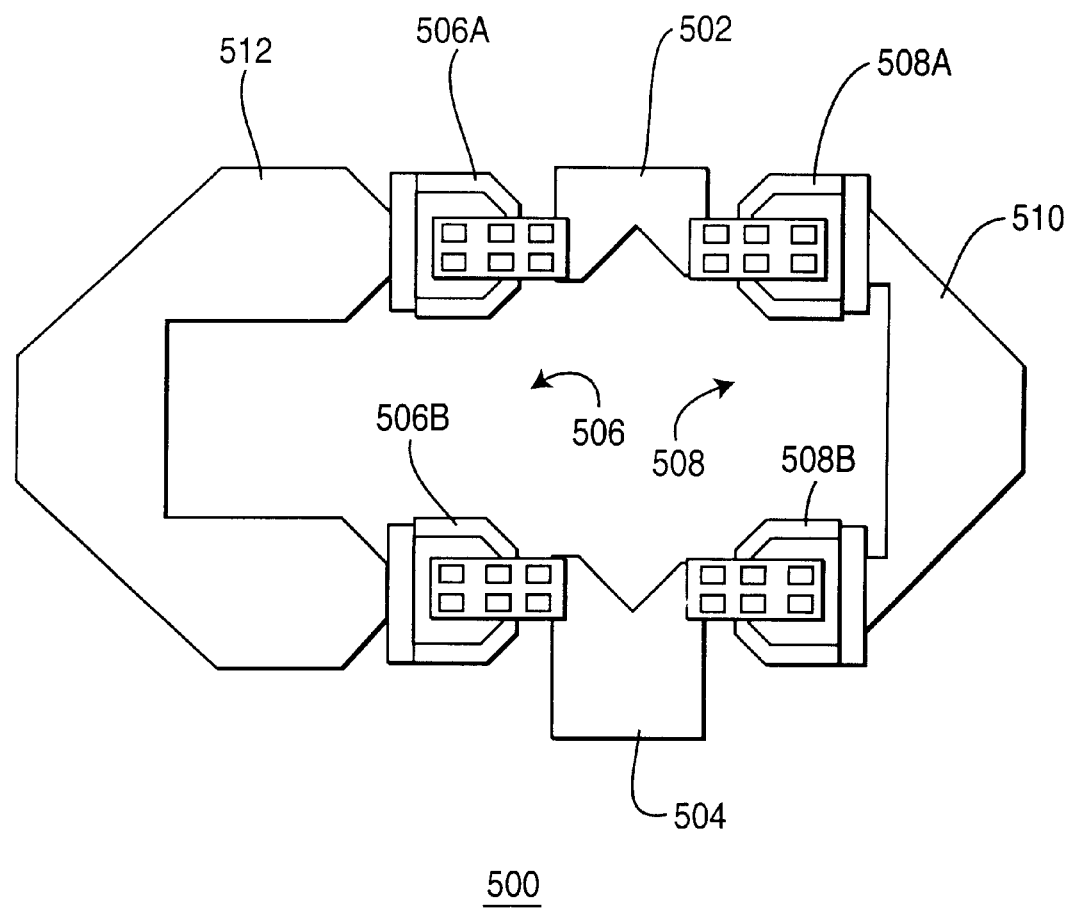
FIG. 5 illustrates an exemplary true-time delay line circuit having MEMS switches of the present invention.

FIG. 5 illustrates an exemplary true-time delay (TTD) line circuit 500 having MEMS switches of the present invention. The illustrative TTD circuit 500 comprises input and output lines 502 and 504, short delay arm 510, longer delay arm 512, and first and second double pole, single throw (DPST) switches 506 and 508. The DPST switches 506 and 508 comprise MEMS switches 506A and 506B, and MEMS switches 508A and 508B, respectively, of the present invention. The short arm 510 corresponds to a first phase shift, whereas the longer arm 512 corresponds to a second phase shift, greater than the first phase shift.

In operation, an input RF signal present at the input line is routed through either the short arm 510, or the longer arm 512, to the output line 504. Specifically, if the first phase shift is required, DPST switch 508 is actuated to insert the short arm 510 into the signal path. If the second phase shift is required, DPST switch 506 is actuated to insert the longer arm 512 into the signal path. The difference in traversal time between the two switch states represents the true-time-delay of the phase-shifter. In this manner, TTD circuit 500 operates as a phase shifter that can be used in applications such as phased arrays. Those skilled in the art appreciate that various configurations of the MEMS switches of the present invention can be used to produce various phase shifts in an RF signal.

FIGS. 6 and 7 depict cross-sectional views illustrating the fabrication steps of the MEMS switch 100. Specifically, FIGS. 6(a)–6(h) and 7(a)–7(h) are cross-sectional illustrations of the fabrication sequence as it affects sections 2B—2B and 2C—2C, respectively, of the MEMS switch 100. The fabrication of MEMS switch 100 begins with the sputter deposition of a metal layer 601 on the top of the substrate 128. The metal layer 601 comprises a chromium layer, a gold layer, and a titanium layer (Cr/Au/Ti), with the chromium layer deposited on the substrate 128 and the titanium layer exposed. A metal layer is also deposited on the backside of the substrate 128 (e.g., titanium, platinum, and gold layers) to form a ground plane, but no further processing is performed on the backside.

Figure 6A:
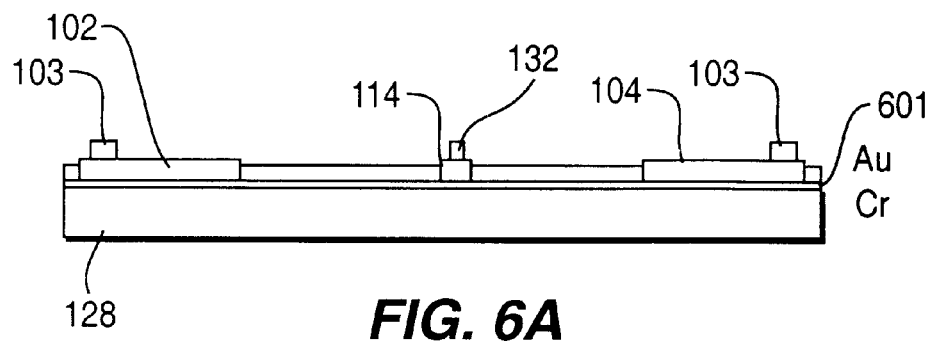
FIGS. 6(a)–(h) are cross-sections illustrating the fabrication steps of the MEMS switch shown in FIG. 1 taken along the section line 2B—2B.
Figure 7A:
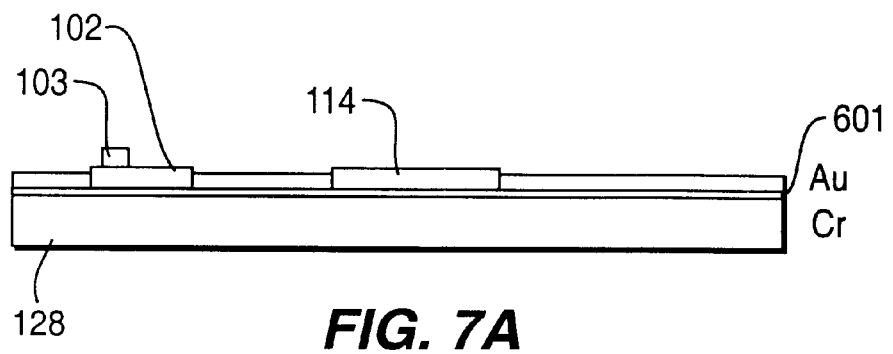
FIGS. 7(a)–(h) are cross-sections illustrating the fabrication steps of the MEMS switch shown in FIG. 1 taken along the section line 2C—2C.

The fabrication continues in FIGS. 6(a) and 7(a) with the formation of the input and output lines 102 and 104, the ridge line 114, the lower fulcrum 132, and the field plates 106 and 108 (not shown). A photoresist pattern for the above elements is defined using conventional photolithography. Specifically, photoresist is spun onto the metal layer 601 and exposed by way of a photomask. The photomask protects the positive acting photoresist on the field and allows the photoresist in the areas where formation is to occur to be exposed. Once the pattern is defined by photoresist development, the exposed titanium in the open areas is etched and gold is electroplated to a thickness of 2.5 to 3 µm. The electroplated gold forms the input and output lines 102 and 104, the ridge line 114, and the field plates 106 and 108 (shown in FIG. 1). The lower fulcrum 132 is formed using a second photoresist pattern on top of the ridge line 114, and gold is electroplated to a thickness up to 3 µm. The fulcrum pattern also defines plating 103 on the input and output lines 102 and 104, and the field plates 106 and 108, which reduces RF and DC losses in the switch 100 and provides a buffer in the plating process for uniform heights. The photoresist patterns are removed, and then the field titanium is etched. The field becomes Cr/Au.

Figure 6B:
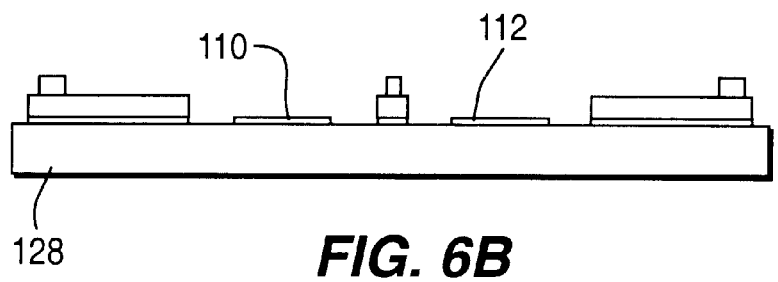
Figure 7B:
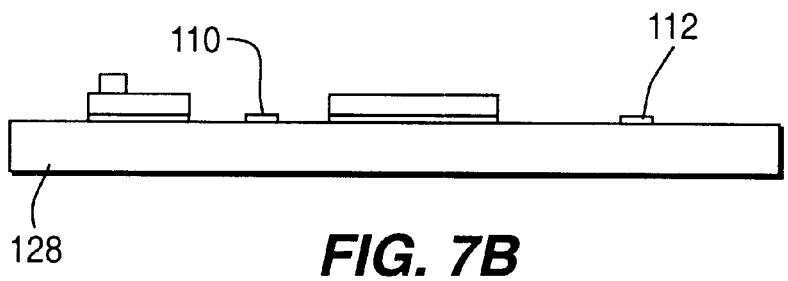

The fabrication continues in FIGS. 6(b) and 7(b) with the formation of the pull-back and pull-down electrodes 110 and 112. A photoresist pattern for the input and output lines 102 and 104, the ridge line 114, and the field plates 106 and 108 is defined using conventional clear field photolithography. Specifically, photoresist is spun onto the substrate 128 and exposed by way of a clear field mask. The clear field mask protects the photoresist in the areas where formation is to occur and allows the photoresist on the field to be exposed. Once the pattern is defined, the field gold is etched while the photoresist protects the plated elements, leaving a field of chromium.

The photoresist is removed and another photoresist pattern for the pull-back and pull down electrodes 110 and 112 is defined using conventional clear field photolithography on the field chromium (that the plated elements are also protected by this second photoresist pattern). The field chromium is etched, leaving moderately resistive chromium forming the electrodes 110 and 112. The field becomes insulating substrate.

Figure 6C:
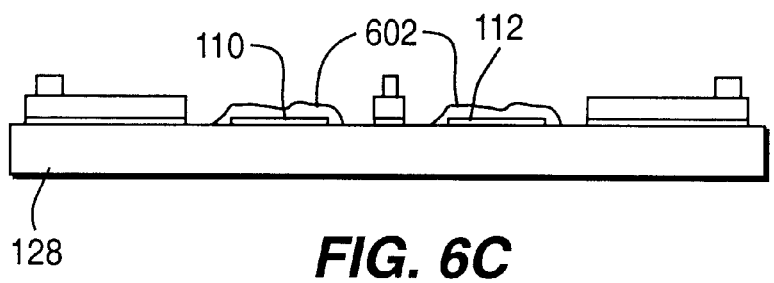
Figure 7C:
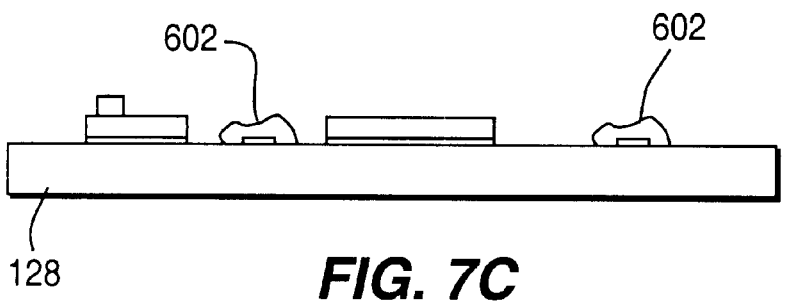

The fabrication continues in FIGS. 6(c) and 7(c) with the formation of silicon nitride ($Si_3N_4$) insulators 602 over the electrodes 110 and 112. A layer of $Si_3N_4$ is deposited over the entire surface of the substrate 128 via plasma-enhanced chemical vapor deposition (PECVD). A photoresist pattern for the $Si_3N_4$ insulators 602 is defined using conventional clear field photolithography. Carbon tetraflouride ($CF_4$) plasma etching removes the unprotected $Si_3N_4$. This leaves a layer of $Si_3N_4$ overlapping the electrodes 110 and 112 and stepped interfaces with the field plates 106 and 108 (not shown), forming the $Si_3N_4$ insulators 602. The photoresist is then removed. The field is still insulating substrate.

Figure 6D:
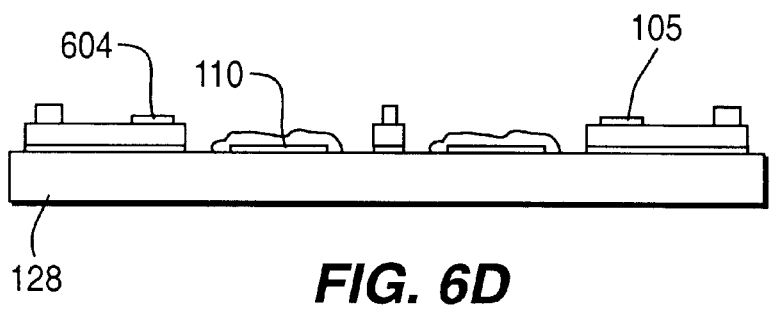
Figure 7D:
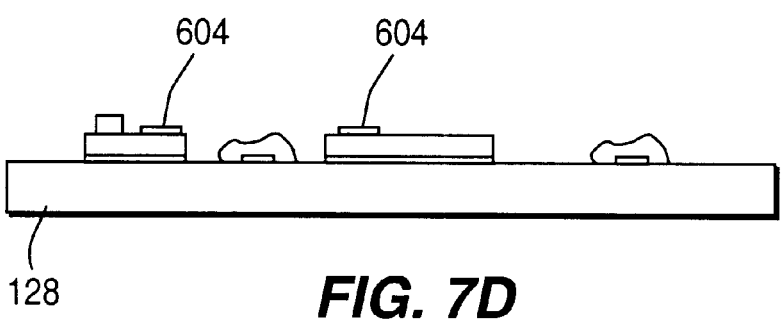

The fabrication continues in FIGS. 6(d) and 7(d) with the formation of the lower contact 105 and a post protect layer 604. The post protect layer 604 will act as an etch-stop layer for a subsequent gold etching step. Specifically, a photoresist pattern for the post protect layer 604 is defined using conventional photolithography. Once this second pattern is defined, thin layers of titanium and gold are evaporated onto the substrate 128. The titanium provides an adhesion to the surface while the gold provides a noble metal for the lower contact 105. The photoresist pattern is then removed, which lifts the titanium and gold from the substrate 128 except for the lower contact 105 on the output line 104, the lower fulcrum 132 on ridge line 114, and the areas where the posts 136 are to be formed. The field is still insulating substrate.

Figure 6E:
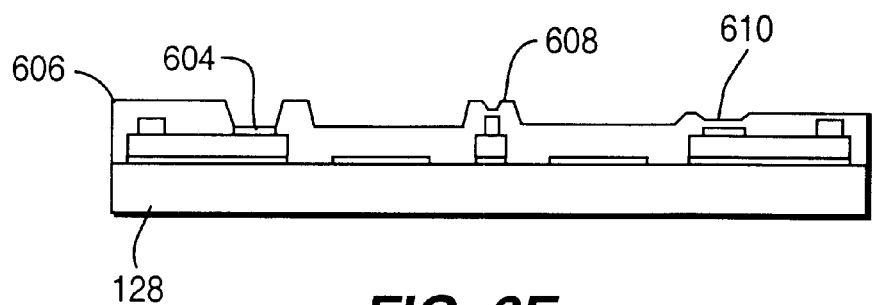
Figure 7E:
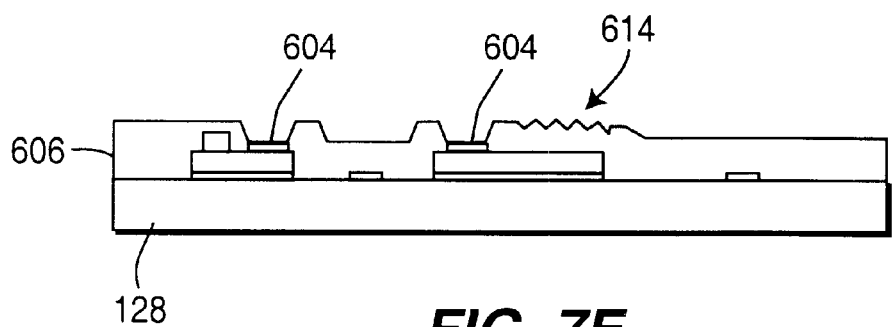

The fabrication continues in FIGS. 6(e) and 7(e) with the formation of a sacrificial layer of photoresist 606 and the formation of dimples 608, 610, and 614. A thick sacrificial layer of photoresist 606 (nominally 3 $\mu$m thick) is deposited over the substrate 128 to define a gap between the elements formed on the substrate (e.g., the electrodes 110 and 112, input and output lines 102 and 104) and the vane 122. The pattern for the sacrificial layer 606 is defined using conventional photolithography. The pattern comprises the pattern for the post protect layer 604 as described above. This leaves the post protect layer 604 exposed.

If a dimpled upper contact 130, corrugated hinges 126, and/or an upper fulcrum 134 are desired, then the sacrificial layer 604 can also be patterned to define dimples 608, 610, and 614. Dimple 608 is formed in the sacrificial layer 606 above the fulcrum 132, which is used to form an upper fulcrum 134. Dimples 610 are formed in the sacrificial layer 606 above the lower contact 105, which are used to form the dimpled upper contact 130. Dimples 614 are formed in the sacrificial layer 606 where the hinges 126 will be formed. In any case, the sacrificial layer 606 is hard baked to round over the photoresist edges. The field is now the sacrificial layer 606. The depth of the dimples is controlled by the exposure condition using a dark-field photomask.

Figure 6F:
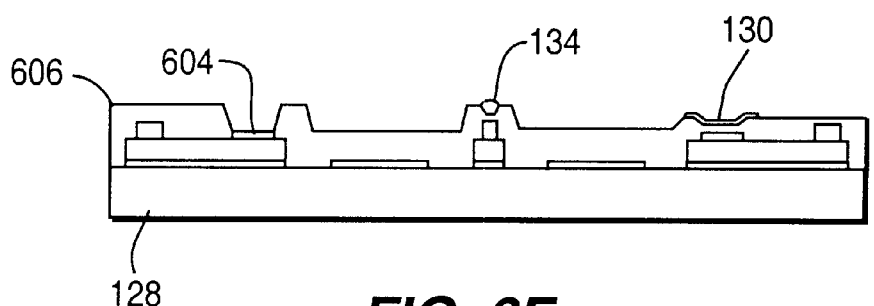
Figure 7F:
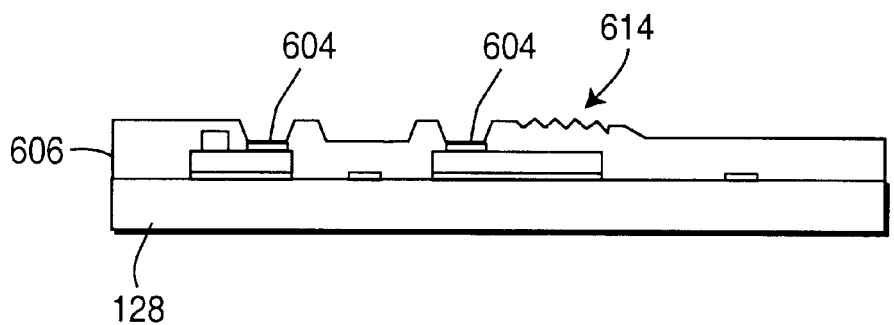

The fabrication continues in FIGS. 6(f) and 7(f) with the formation of the upper fulcrum 134 (if desired) and the upper contact 130. Specifically, a metal layer (not shown) comprising a noble metal layer (e.g., gold, platinum) and a titanium layer is deposited on top of the sacrificial layer 606. A photoresist pattern is then formed on top of the field titanium for the upper fulcrum 134 and the upper contact 130 using conventional clear field photolithography. The field titanium is etched and the photoresist is removed using a flood exposure and photoresist development process, which does not affect the sacrificial layer 606. This leaves a gold/titanium layer over the upper fulcrum dimple 608 and the upper contact dimple 610, and a gold field over the remaining portion of the sacrificial layer 606. The gold field is then etched using the titanium over the upper fulcrum dimple 608 and upper contact dimple 610 as protection to transfer the pattern. After the field gold is etched, the titanium is removed via etching, leaving the gold upper fulcrum 134 and the gold upper contact 130 alone on top of the sacrificial layer 606.

Figure 6G:
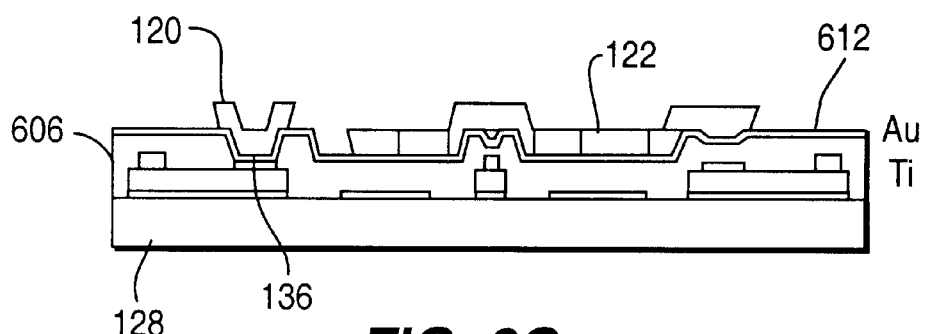
Figure 7G:
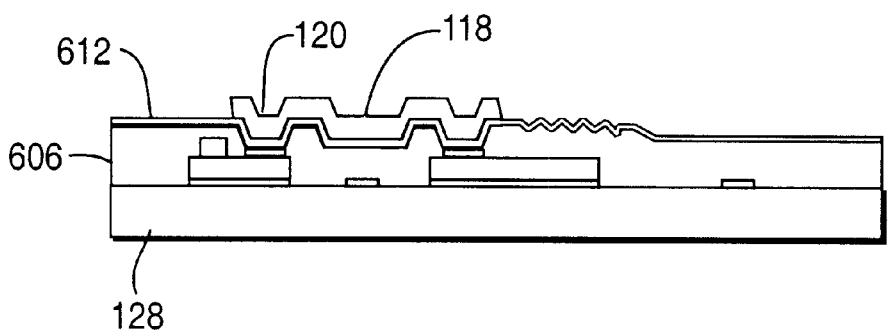

The fabrication continues in FIGS. 6(g) and 7(g) with the formation of the vane 122 and the frame 120. Specifically, a seed layer comprising a titanium layer, a gold layer, and a titanium layer is deposited over the sacrificial layer 604 using the post clear field mask (i.e., the sacrificial layer 606 is covered while the post layer 604 is not). A thick photoresist pattern for the frame 120 and the vane 122 is then defined using conventional photolithography. The exposed titanium of the seed layer 612 is etched, and gold is electroplated to a thickness of 2.5 to 3 $\mu$m to form the vane 122 and the frame 120. The photoresist is removed by a flood exposure and development process without affecting the sacrificial layer 606. The frame 120 now contacts the input line 102 and the ridge contact 114 via posts 136 formed in the post layer 604. The field is now Au/Ti (i.e., layer 612).

Figure 6H:
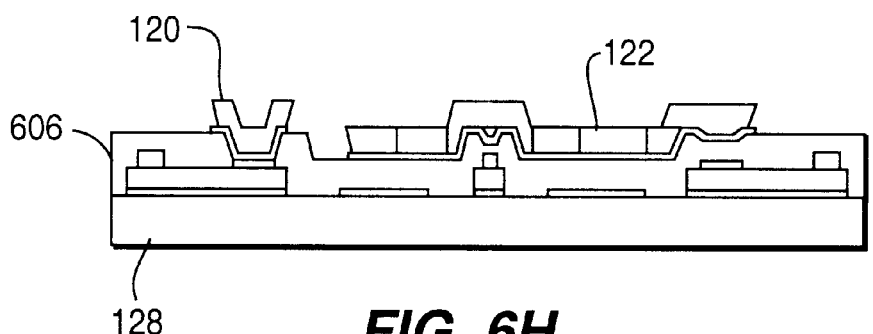
Figure 7H:
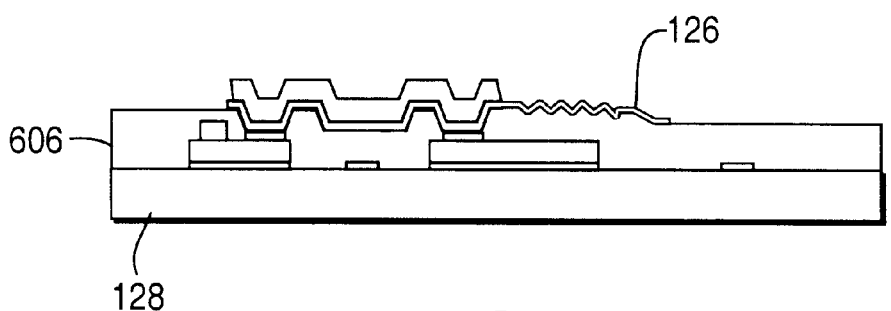

The fabrication continues in FIGS. 6(h) and 7(h) with the formation of the hinges 126. Specifically, a photoresist pattern for the hinges 126, the frame 120, and the vane 122 is defined using conventional clear field photolithography. The exposed layer 612 is etched. The photoresist pattern protects a portion of the Au/Ti layer 612 that forms the hinges 126. In addition, the pattern protects the plated gold vane 122 and frame 120. The field is now the sacrificial layer 606 over the lower patterns.

The fabrication of the MEMS switch concludes with the removal of the sacrificial layer of photoresist 606. The resulting MEMS switch is depicted in FIGS. 1 and 2. The sacrificial layer 606 is removed with a combination of oxygen plasma etching, wet chemical etching, and critical-point $CO_2$ drying.

While foregoing is directed to the preferred embodiment of the present invention, other and further embodiments of the invention may be devised without departing from the basic scope thereof, and the scope thereof is determined by the claims that follow.

What is claimed is:

1. A radio frequency (RF) switch formed on a substrate having an input line and an output line, the RF switch comprising:

a frame for receiving RF signals from the input line;

a first hinge and a second hinge, each of the first hinge and the second hinge having a first end and a second end, where the respective first ends of the first hinge and the second hinge are supported from the frame;

a vane for coupling RF signals to the output line, the vane having a first end and a second end, the vane being supported above the substrate between respective second ends of the first hinge and the second hinge;

a first electrode formed on the substrate beneath the vane proximate the first end of the vane; and a second electrode formed on the substrate beneath the vane proximate the second end of the vane.

2. The RF switch of claim 1 wherein the first electrode is configured for receiving a predetermined voltage for rotating the vane about a pivot axis parallel to the substrate such that the first end of the vane contacts the output line; and the second electrode is configured for receiving a predetermined voltage for rotating the vane about the pivot axis such that the first end of the vane is positioned remote from the output line.

3. The RF switch of claim 1 further comprising:

a ridge line formed on the substrate between the input line and the output line, the ridge line having a fulcrum, the ridge line being electrically coupled to the input line via the frame;

wherein the vane contacts the fulcrum when at least one of the first and second electrodes receives the predetermined voltage.

4. The RF switch of claim 3 wherein the vane further comprises an upper fulcrum formed thereon facing the fulcrum.

5. The RF switch of claim 1 further comprising:

a dimpled contact formed on the first end of the vane above the output line.

6. The RF switch of claim 1 wherein the first and second hinges comprise corrugated hinges.

7. The RF switch of claim 1 wherein the first and second electrodes are encapsulated with an insulator.

8. The RF switch of claim 1 wherein the vane further comprises one or more openings formed therein.

9. A method of forming a microelectronic mechanical systems (MEMS) switch on a substrate comprising:

(a) forming on the substrate input and output lines, and a ridge line having a fulcrum;

(b) forming first and second electrodes on the substrate;

(c) depositing a sacrificial photoresist layer over the substrate avoiding contact with a first post portion of the input line and a second post portion of the ridge line;

(d) forming an upper contact on a portion of the sacrificial photoresist layer over the output line;

(e) forming a frame on the sacrificial photoresist layer contacting the first post portion and the second post portion;

(f) forming a vane on the sacrificial photoresist layer contacting the upper contact at one of the opposing ends of the vane;

(g) forming a pair of hinges on the sacrificial photoresist layer electrically coupling the frame to the vane; and (h) removing the sacrificial photoresist layer.

10. The method of claim 9 wherein step (d) further comprises forming an upper fulcrum on the sacrificial photoresist layer over the fulcrum and step (f) further comprises forming the vane on the sacrificial photoresist layer contacting the upper fulcrum between opposing ends of the vane.

11. The method of claim 9 further comprising between steps (b) and (c) depositing an insulating layer over the first and second electrodes.

12. The method of claim 9 further comprising between steps (c) and (d) forming a first dimpled portion on the sacrificial layer over the output contact and a second dimpled portion on the sacrificial layer under the pair of hinges.

13. A radio frequency (RF) switch formed on a substrate having input and output lines, the RF switch comprising:

a ridge line formed on the substrate between the input line and the output line, the ridge contact having a fulcrum;

a frame supported on the input line for electrically coupling the input line to the ridge line;

first and second hinges each having a first end supported from the frame;

a vane having an upper contact formed on one end of the vane facing the output line and an upper fulcrum formed on the vane facing the fulcrum, the vane being supported above the substrate between second ends of the first and second hinges so as to define a pivot axis of the vane that is parallel to the substrate;

a first electrode formed on the substrate beneath the vane proximate the upper contact for receiving a predetermined voltage to cause the vane to rotate about the pivot axis such that the upper contact contacts the output contact and the upper fulcrum contacts the fulcrum; and a second electrode formed on the substrate beneath the vane opposite the upper contact for receiving a predetermined voltage to cause the vane to rotate about the pivot axis such that the upper contact is positioned remote from the output contact.

14. The RF switch of claim 13 wherein the upper contact comprises a dimpled contact.

15. The RF switch of claim 13 wherein the first and second hinges comprise corrugated hinges.

16. The RF switch of claim 13 wherein the first and second electrodes are encapsulated with an insulator.

17. The RF switch of claim 13 wherein the vane further comprises one or more openings formed therein.

* * * * *